(12) United States Patent
Riordon

(10) Patent No.: US 9,070,535 B2
(45) Date of Patent: Jun. 30, 2015

(54) PROXIMITY MASK FOR ION IMPLANTATION WITH IMPROVED RESISTANCE TO THERMAL DEFORMATION

(71) Applicant: Varian Semiconductor Equipment Associates, Inc., Gloucester, MA (US)

(72) Inventor: Benjamin B. Riordon, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 66 days.

(21) Appl. No.: 13/926,369

(22) Filed: Jun. 25, 2013

(65) Prior Publication Data

US 2014/0374626 A1 Dec. 25, 2014

(51) Int. Cl.
  *G21F 5/00* (2006.01)
  *H01J 37/317* (2006.01)
  *G03F 1/20* (2012.01)

(52) U.S. Cl.
  CPC .............. *H01J 37/3171* (2013.01); *G03F 1/20* (2013.01)

(58) Field of Classification Search
  CPC .............. G03F 1/00; G03F 1/20; G03F 1/22; G03F 1/38; G03F 1/42; G03F 1/60; G03F 1/76; G03F 1/80

USPC ........ 250/515.1, 505.1, 492.1, 492.2, 492.21, 250/492.22
See application file for complete search history.

(56) References Cited

U.S. PATENT DOCUMENTS

| | | | |
|---|---|---|---|
| 6,300,017 B1 * | 10/2001 | Rolfson et al. | 430/5 |
| 6,610,989 B1 * | 8/2003 | Takahashi | 250/492.3 |
| 6,653,639 B1 * | 11/2003 | Novak | 250/491.1 |
| RE41,307 E * | 5/2010 | Donders et al. | 355/53 |
| 2006/0068298 A1 * | 3/2006 | Sano et al. | 430/5 |
| 2007/0138412 A1 * | 6/2007 | Freer | 250/492.21 |
| 2011/0320030 A1 | 12/2011 | Riordon et al. | |

\* cited by examiner

*Primary Examiner* — Nicole Ippolito
*Assistant Examiner* — Jason McCormack

(57) ABSTRACT

A proximity mask for ion implantation that is configured to resist thermal deformation in a direction normal to an ion beam projected on and through the mask. The mask may include a frame defining a central aperture and a plurality of ribs disposed within the aperture. The ribs may define a doping pattern and may be configured to deform in a direction normal to an ion beam projected thereon and to resist deformation in a direction orthogonal to an ion beam projected thereon upon being heated. Particularly, at least one of the ribs may include a bridge member, first and second perpendicular support legs extending perpendicularly from the bridge member, and first and second parallel support legs that extend perpendicularly from the first and second perpendicular support legs, respectively. The first and second parallel support legs may be attached to the frame.

20 Claims, 11 Drawing Sheets

PROXIMITY MASK FOR ION IMPLANTATION WITH IMPROVED RESISTANCE TO THERMAL DEFORMATION

FIELD OF THE DISCLOSURE

The disclosure relates generally to the field of semiconductor device fabrication, and more particularly to a proximity mask for ion implantation that is configured to mitigate distortion of an ion beam pattern projected therethrough.

BACKGROUND OF THE DISCLOSURE

Ion implantation is a process used to dope ions into a work piece or target substrate. For example, ion implantation may be used to implant III-group or V-group impurity ions during the manufacture of semiconductor substrates to obtain desired electrical device characteristics. An ion implanter generally includes an ion source chamber which generates ions of a particular species, a series of beam line components configured to shape, analyze, and drive an ion beam extracted from the source chamber, and a platen for holding the target substrate (e.g., a wafer) into which the ion beam is steered. These components are housed in a vacuum environment to prevent dispersion of the ion beam during its travel from the source to the target.

The beam line components of an ion implanter may include a physical mask, often referred to as a "proximity mask," that is suspended in the path of an ion beam for blocking a portion of the beam and thereby projecting a desired implantation pattern on a substrate. A problem commonly associated with such masks it that, when exposed to an ion beam projected thereon and therethrough, portions of the mask may heat up and expand, causing the mask to deform. Such deformation can result in the distortion of a desired implantation pattern, which may render an implanted substrate ineffective or inoperable for its intended purpose.

SUMMARY

In view of the foregoing, it would be advantageous to provide a proximity mask for ion implantation that is configured to resist thermal deformation in a direction normal to an ion beam projected on and through the mask wherein, if unmitigated, such deformation could result in the distortion of an ion beam pattern projected through the mask.

An exemplary proximity mask in accordance with the present disclosure may include a frame defining a central aperture and a plurality of ribs disposed within the aperture. The ribs may define a doping pattern and may be configured to deform in a direction parallel to an ion beam projected thereon and to resist deformation in a direction normal to an ion beam projected thereon upon being heated. Particularly, at least one of the ribs may include a bridge member, first and second perpendicular support legs extending perpendicularly from the bridge member, and first and second parallel support legs that extend perpendicularly from the first and second perpendicular support legs, respectively. The first and second parallel support legs may be attached to the frame. Thus arranged, thermal expansion of the proximity mask due to exposure to an ion beam is accommodated by the bridge member so that the distance between adjacent ribs is substantially maintained.

DETAILED DESCRIPTION

Figure 1:
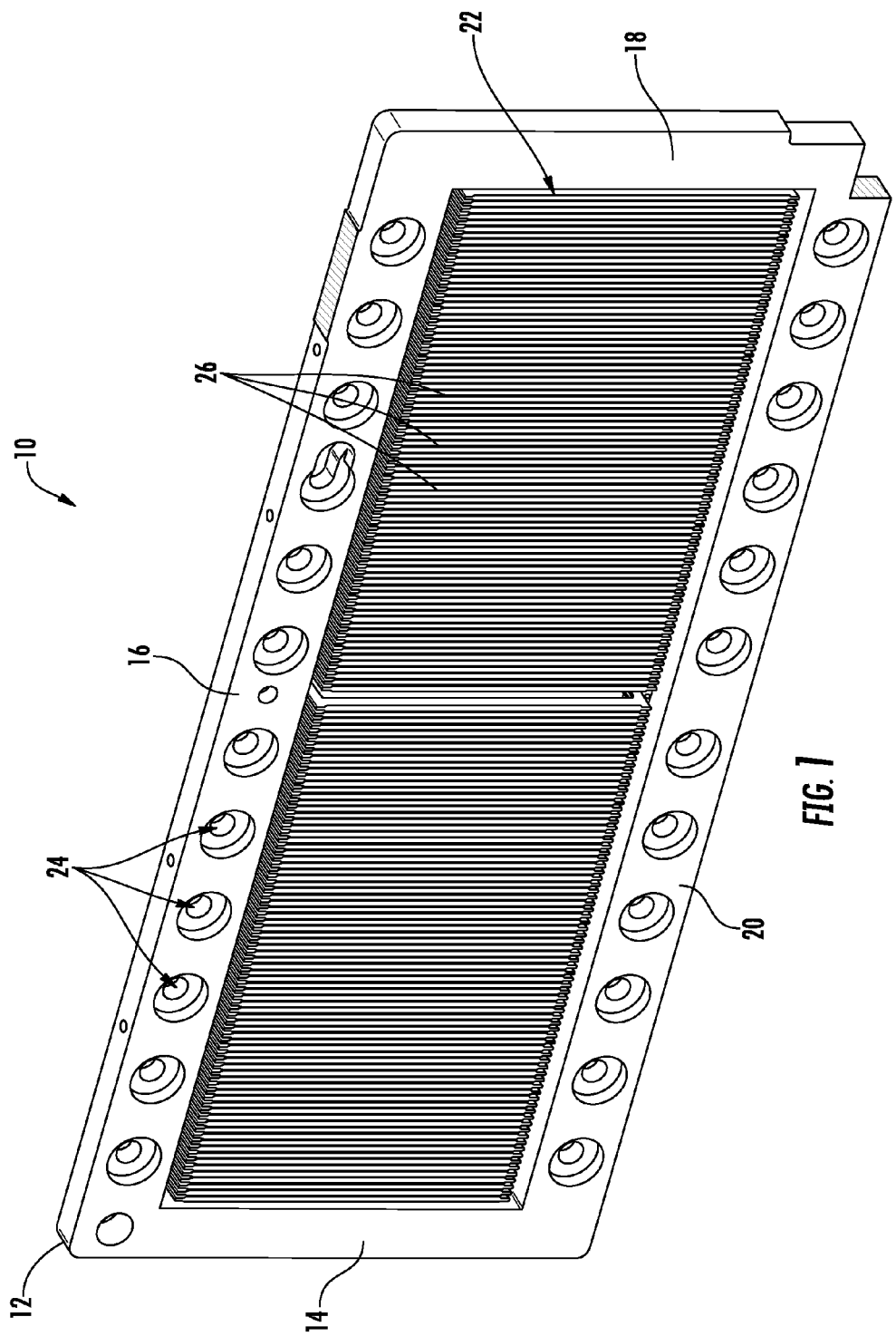
FIG. 1 is a front perspective view illustrating an exemplary ion implanter proximity mask in accordance with the present disclosure.

A device in accordance with the present disclosure will now be described more fully hereinafter with reference to the accompanying drawings, in which preferred embodiments of the device are shown. This device, however, may be embodied in many different forms and should not be construed as being limited to the embodiments set forth herein. Rather, these embodiments are provided so that this disclosure will be thorough and complete, and will fully convey the scope of the device to those skilled in the art. In the drawings, like numbers refer to like elements throughout.

Figure 2:
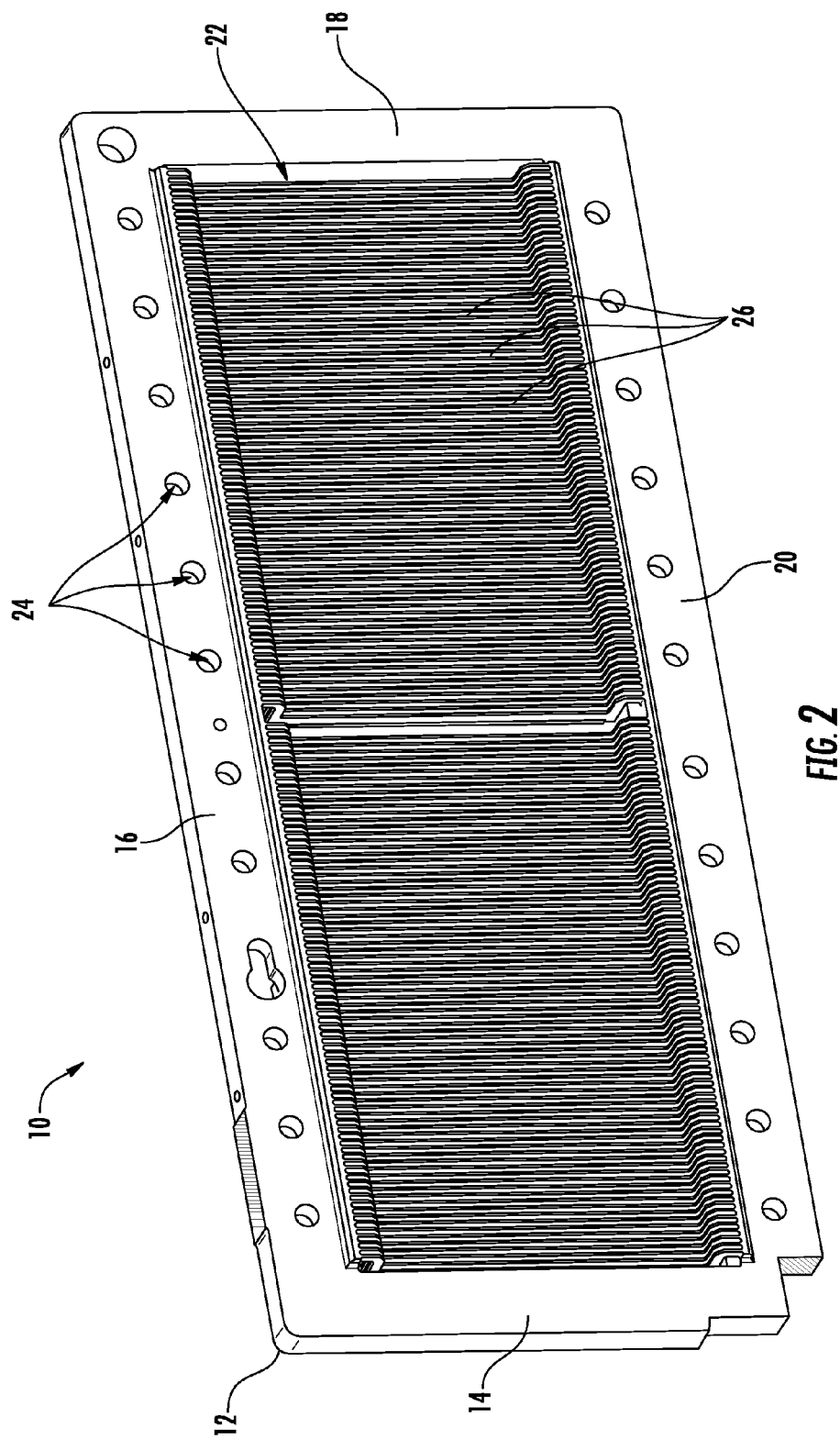
FIG. 2 is a rear perspective view illustrating the ion implanter proximity mask shown in FIG. 1.
Figure 3:
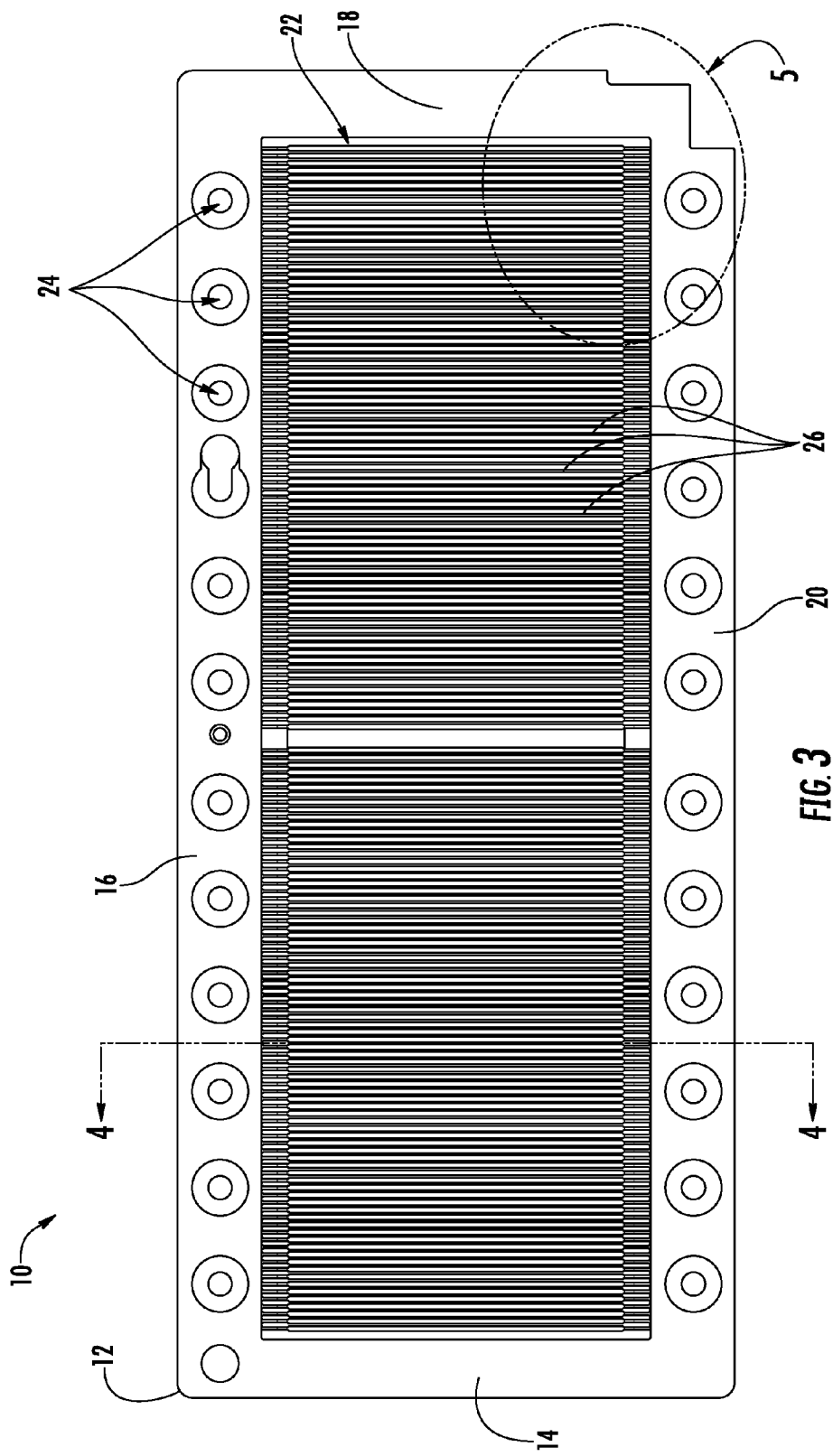
FIG. 3 is a front view illustrating the ion implanter proximity mask shown in FIG. 1.

Referring to FIGS. 1-3, an exemplary ion implanter proximity mask 10 (hereinafter referred to as "the mask 10") in accordance with the present disclosure is shown. For the sake of convenience and clarity, terms such as "front," "rear," "top," "bottom," "inwardly," "outwardly," "lateral," "longitudinal," and "vertical" will be used herein to describe the relative placement and orientation of components of the mask 10, each with respect to the geometry and orientation of the mask 10 as it appears in FIGS. 1-3. Particularly, the "front" of the mask 10 is shown in FIG. 1 and the "rear" of the mask 10 is shown in FIG. 2. The term "lateral" shall be used herein to define relative positions and locations between the top and bottom of the mask 10, the term "longitudinal" shall be used to define relative positions and locations between the left and right sides of the mask 10, and the term "vertical" shall be used to define relative positions and locations between the front and the rear of the mask 10. All such terminology will include the words specifically mentioned, derivatives thereof, and words of similar import.

The mask 10 may include a substantially planar frame 12 having four adjoining sides 14, 16, 18, and 20 that define a central aperture 22. The sides 14-20 of the frame 12 may include a plurality of mounting holes 24 formed therethrough for accepting mechanical fasteners to facilitate attachment of the frame 12 to the interior of a process chamber of an ion implanter (not shown). Particularly, the frame 12 may be adapted for installation within a process chamber at a position intermediate an ion source and a target substrate as further described below. The frame 12 may include a plurality of mounting holes 24 for accepting a corresponding plurality of mechanical fasteners. It will be appreciated that the disclosed frame 12 may be configured to receive a substantially larger number of fasteners relative to traditional proximity masks. This provides an increased number of high contact pressure regions at the junctures of the fasteners (not shown) and the frame 12, thereby improving thermal conductivity and heat dissipation which may otherwise be poor in the vacuum environment of the process chamber.

The frame 12 and the central aperture 22 of the mask 10 are shown as having a generally rectangular shape, but this is not critical. It is contemplated that the frame 12 and/or the central aperture 22 may alternatively have a variety of other shapes, including, but not limited to, circular, oval, triangular, irregular, etc., such as may be appropriate for suiting a particular application (e.g., for implementation within a process chamber having a corresponding shape).

Referring to FIGS. 1-4, the mask 10 may include a plurality of parallel, longitudinally-spaced ribs 26 that extend laterally across the central aperture 22 between the sides 16 and 20 of the frame 12. The ribs 26 may define a plurality of open slits or slots 28 (best shown in FIGS. 5 and 6) therebetween which delineate a desired ion doping pattern. As will be appreciated, when an ion beam is projected onto the mask 10, the slots 28 may allow a portion of the beam to pass through the mask 10 and onto a substrate disposed on an opposite side of the mask 10 relative to the source of the ion beam. The portion of the ion beam that is allowed to pass through the mask 10 may thereby create a doped region in the substrate having a shape that corresponds to the doping pattern defined by the slots 28 in the mask 10.

The doping pattern defined by the slots 28 in the exemplary mask 10 includes a plurality of parallel, longitudinally-spaced, laterally-extending segments, but it will be appreciated that the ribs 26 may be arranged in a variety of alternative configurations for defining a variety of alternative doping patterns, such as may be desirable for various doping applications. For example, it is contemplated that the mask 10 may include a greater or lesser number of ribs 26, and/or that one or more of the ribs 26 may be formed with a different size, may be formed with a different shape, may extend in a different direction, and/or may intersect one or more adjacent ribs 26. All such variations may be implemented without departing from the scope of the present disclosure.

It is contemplated that the entire mask 10, including the frame 12 and the ribs 26, may be formed from a single piece of material that exhibits good thermal and electrical conductivity, and that is insensitive to thermal shock, that is dense, and that is substantially free of implant contaminants. Materials that exhibit such characteristics include, but are not limited to graphite and silicon carbide. The mask 10 may be machined from a single block of such material, for example. Alternatively, it is contemplated that the frame 12 and the ribs 26 may be formed as separate components made from the same or different materials, and may subsequently be joined together, such as by welding, mechanical fasteners or other means of attachment, to form the completed mask 10.

Figure 4:
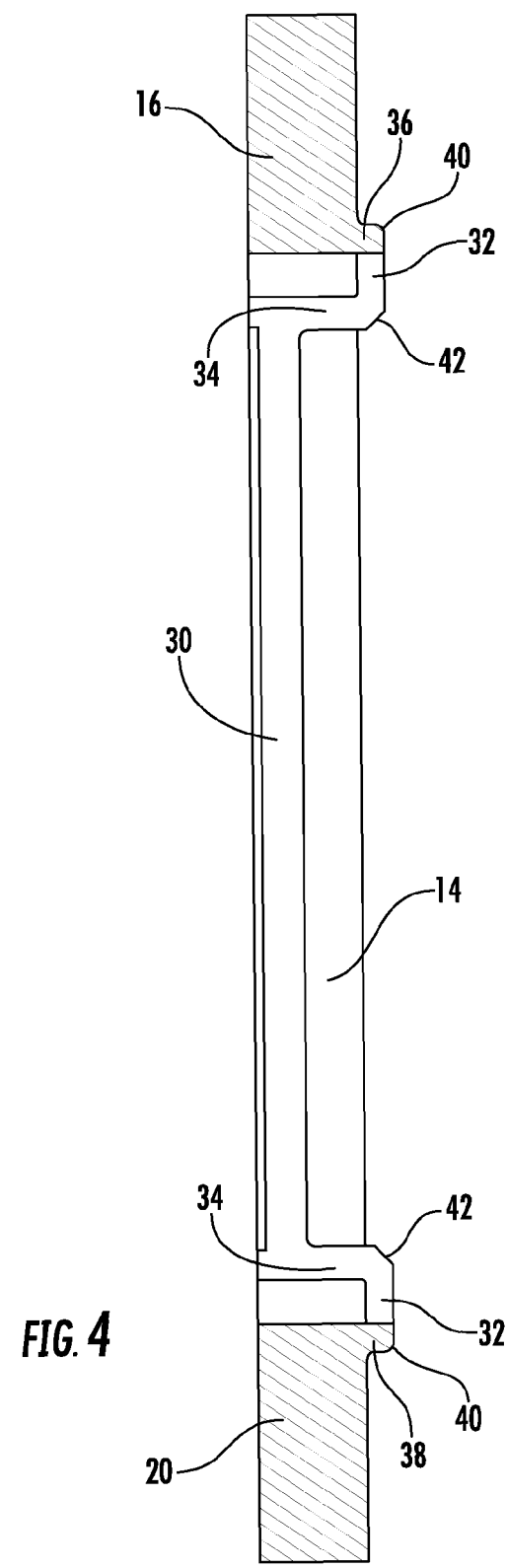
FIG. 4 is a longitudinal cross section view illustrating the ion implanter proximity mask taken along line 4-4 of FIG. 3.

Referring to FIG. 4, a longitudinal cross-section of the mask 10 is shown which illustrates a detailed side view of one of the ribs 26. The depicted rib 26 is substantially identical to each of the other ribs 26 of the mask 10. It will therefore be appreciated that the following description of the rib 26 shall apply equally to each of the other ribs 26.

The rib 26 may include a central bridge member 30 connected at its lateral ends to the laterally-opposing sides 16 and 20 of the frame 12 by respective pairs of adjoining parallel and perpendicular support legs 32 and 34. Particularly, the parallel support legs 32 may extend laterally-inwardly from respective first and second flanges 36 and 38 that extend rearward from the respective sides 16 and 20 of the frame 12. Alternatively, it is contemplated that the flanges 36 and 38 may be omitted and that the parallel support legs 32 may instead extend laterally-inwardly directly from the sides 16 and 20 of the frame 12. The perpendicular support legs 34 may extend perpendicularly from the inward ends of the parallel support legs 32, vertically toward the front of the mask 10, where they connect to the bridge member 30 in a perpendicular relationship therewith.

Figure 8:
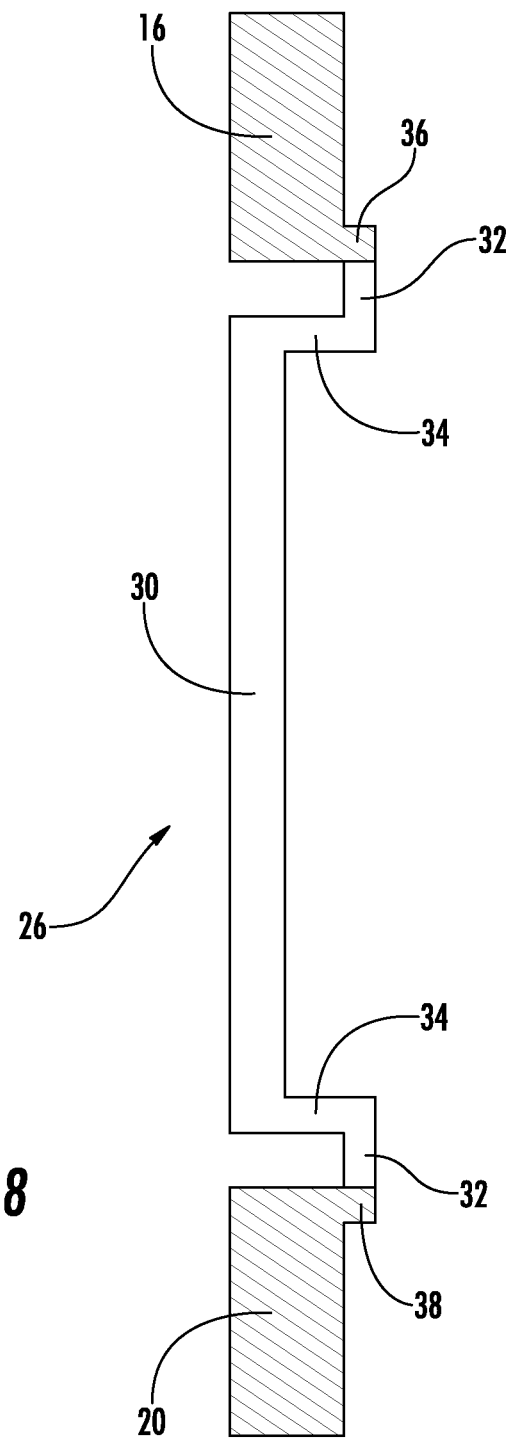
FIG. 8 is a side view illustrating a rib of the ion implanter proximity mask shown in FIG. 1 in an unheated, relaxed state.
Figure 9:
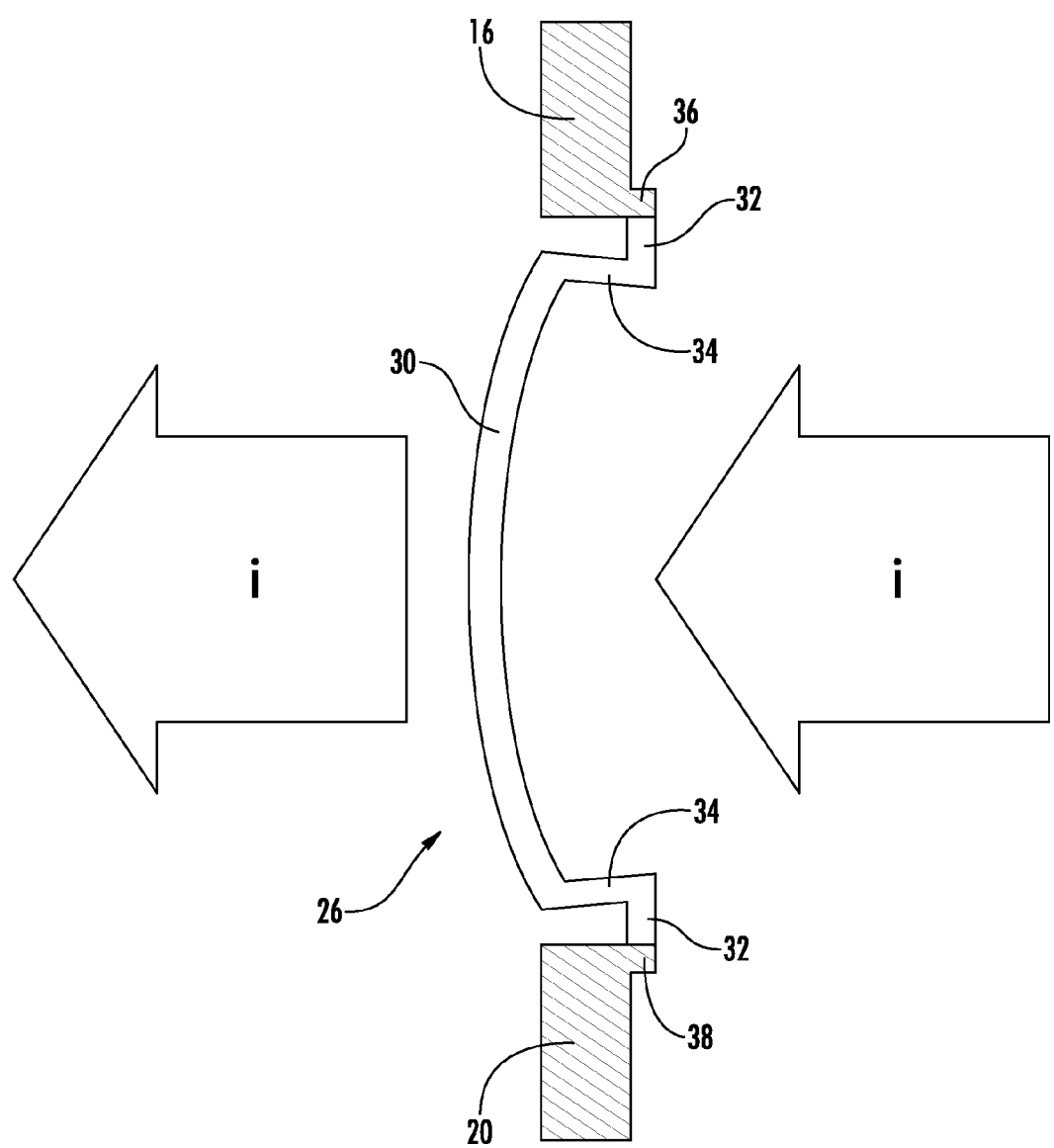
FIG. 9 is a side view illustrating a rib of the ion implanter proximity mask shown in FIG. 1 in a heated, flexed state.

The junctures of the parallel support legs 32 and the respective first and second flanges 36 and 38 may include chamfers 40, but this is not critical. Similarly, the junctures of the parallel support legs 32 and the perpendicular support legs 34 may include chamfers 42, but this is also not critical. The chamfers 40 and 42 may reduce the mechanical stiffness of the rib 26, without increasing mechanical stress (i.e., potential for fracture). It is contemplated that one or more of the above described junctures may alternatively be square (as shown in FIGS. 8 and 9) or rounded instead of chamfered. It is further contemplated that one or more of the junctures may include multiple chamfers.

Figure 5:
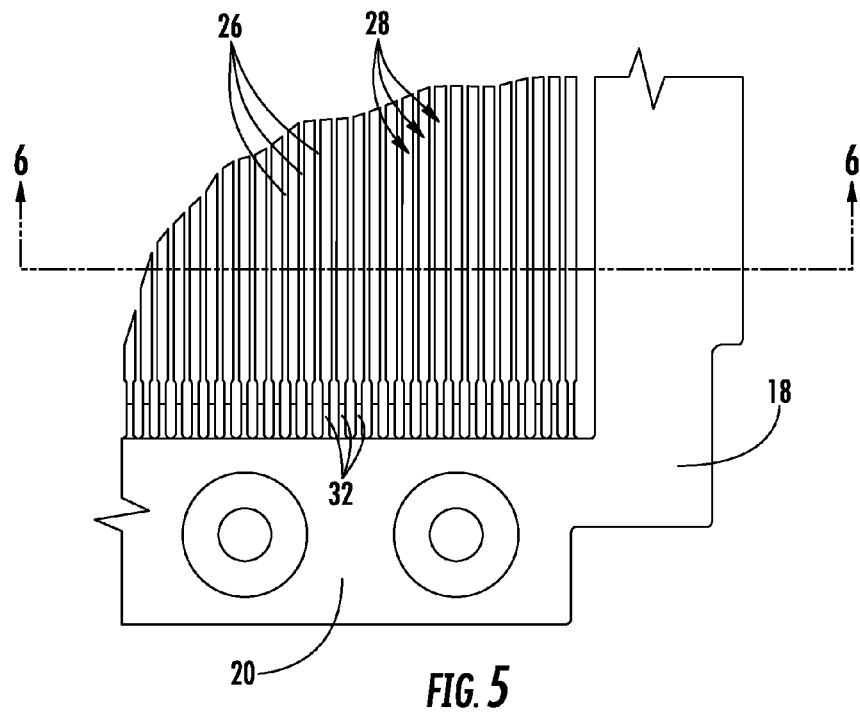
FIG. 5 is a partial front view illustrating the ion implanter proximity mask shown in FIG. 3.

Referring to the detailed front view of the mask 10 shown in FIG. 5, the support legs 32 and 34 of the ribs 26 may be slightly thinner (i.e., smaller in the longitudinal dimension of the mask 10) than that the bridge members 30, but this is not critical. It is contemplated that the support legs 32 and 34 may alternatively have the same thickness as, or may be thicker than, the bridge members 30.

Figure 6:
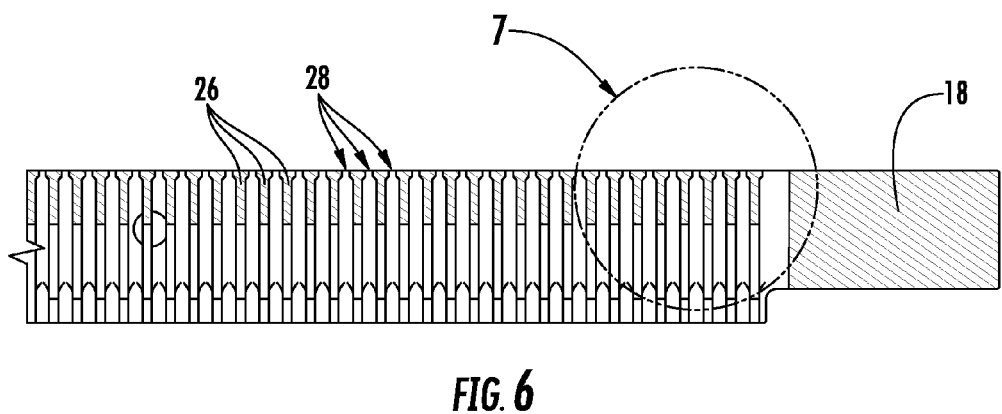
FIG. 6 is a lateral cross section view illustrating the ion implanter proximity mask taken along line 6-6 of FIG. 5.
Figure 7:
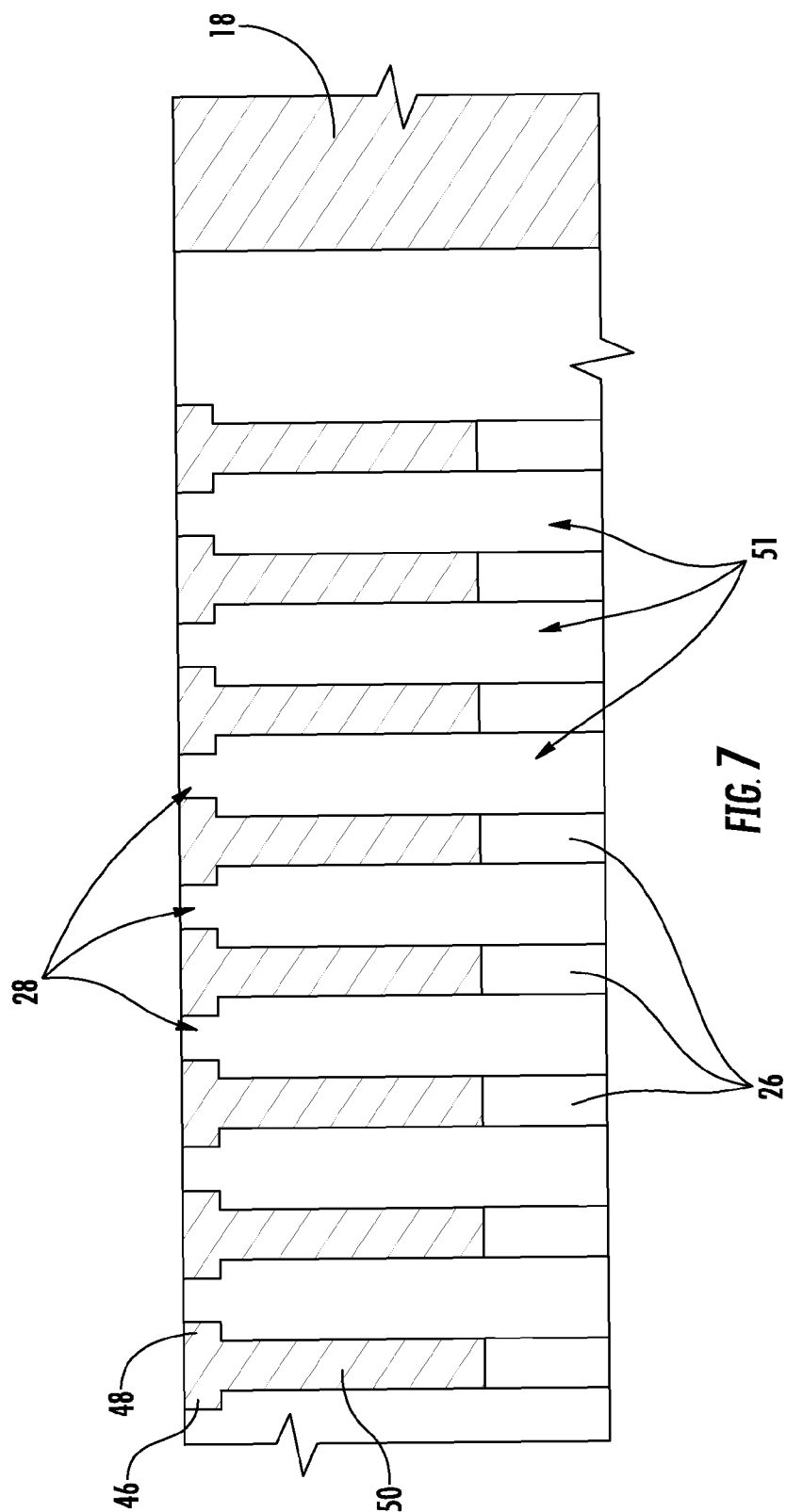
FIG. 7 is a partial lateral cross section view illustrating the ion implanter proximity mask shown in FIG. 6.

FIGS. 6 and 7 show respective lateral cross-section and detailed lateral cross-section views of the mask 10. As shown, each of the ribs 26 of the mask 10 may have a substantially T-shaped cross-section with flanges 46 and 48 that extend longitudinally-outwardly from the front edge of a vertically-elongated central member 50. It is contemplated that the flanges 46 and 48 may alternatively be omitted, and that the ribs 26 may have a uniform thickness from front to rear (i.e. top to bottom in FIGS. 6 and 7). It is further contemplated that one or more of the ribs 26 may be formed with any of a variety of alternative cross-sectional shapes, including, but not limited to, triangular, circular, L-shaped, etc.

Figure 10:
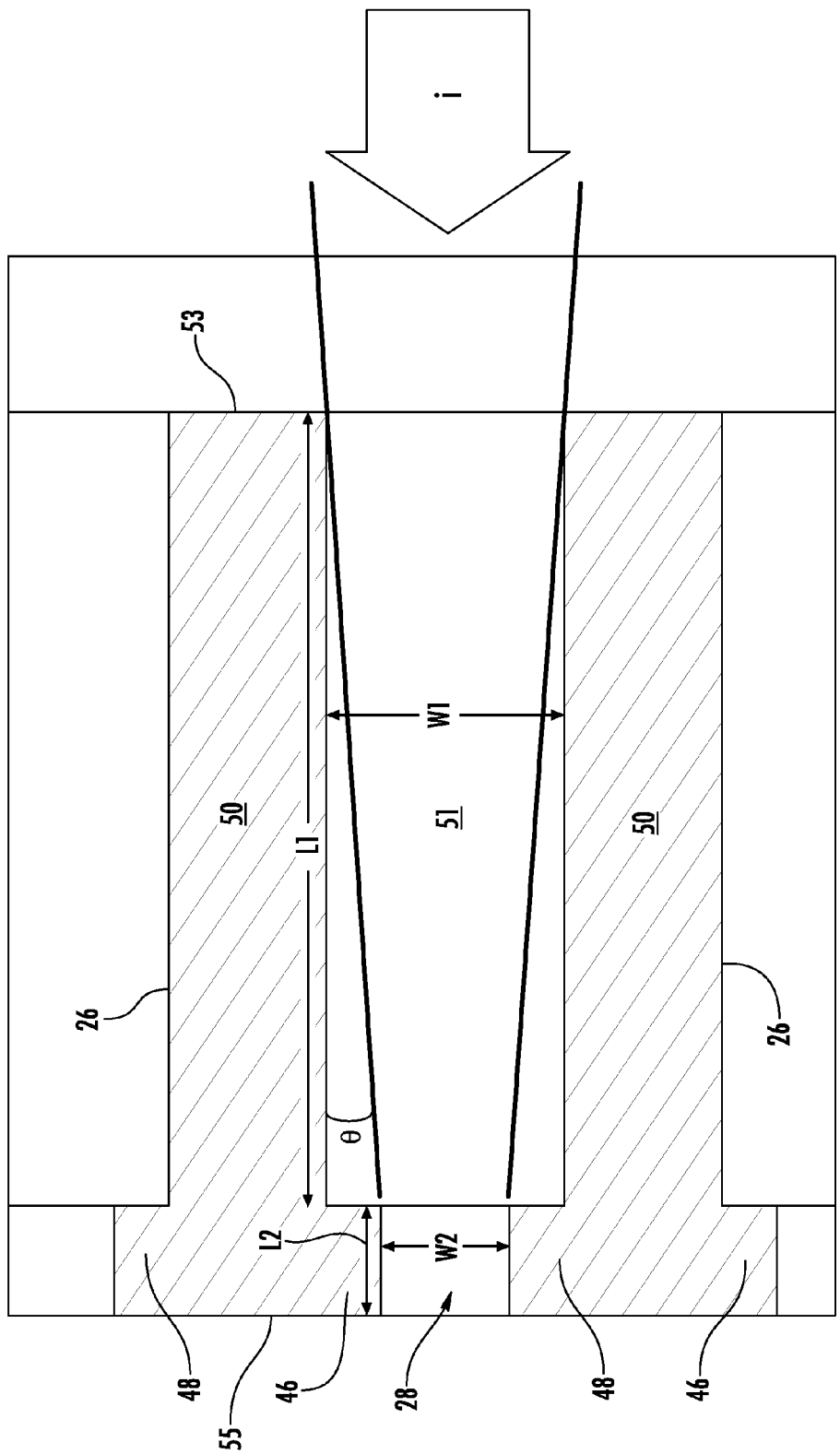
FIGS. 10 and 11 are detailed lateral cross section views of a pair of adjacent ribs of the ion implanter proximity mask shown in FIG. 1 with an ion beam being projected therethrough.

Referring to FIGS. 7 and 10, the flanges 46 and 48 of the ribs 26, and particularly the slots 28 located intermediate the flanges 46 and 48 of adjacent ribs 26, define a desired doping pattern as described above. The central members 50 of the ribs 26 provide the ribs 26 with mechanical support and facilitate heat dissipation from the ribs 26 to the frame 12 as further described below. Slots 51 located intermediate the central members 50 of the ribs 26 may allow an ion beam i to enter the mask 10 as shown in FIG. 10. The slots 51 may have a first width "W1" defined between adjacent central members 50. This first width "W1" may be maintained for a length "L1" as measured from the side 53 of the mask 10 facing the incoming ion beam i. The first width "W1" defines the area in which the ion beam i is "accepted" into the mask 10. The slots 51 may further have a second width "W2" defined between adjacent flanges 46, 48 of adjacent ribs 26. This second width "W2" is maintained for a length "L2" as measured from the side 55 of the mask opposite the incoming ion beam i. In the illustrated embodiment, "W1" is greater than "W2," and "L1" is greater than "L2." As can be seen, the respective widths "W1" and "W2" define what is referred to as an acceptance angle $\theta$ (see FIG. 10) for receiving a portion of the ion beam i through the mask 10. As will be appreciated, the acceptance angle $\theta$ defines a range of ion beam angles having a direct "line-of-sight" path between the sides 53, 55 of the mask.

By adjusting the sizes of the first and second widths "W1," "W2" and the first and second lengths "L1," "L2," the acceptance angle can be adjusted. For example, for embodiments in which the first width "W1" is relatively large, the second width "W2" is relatively small, and the first length "L1" is relatively large. Conversely, for embodiments in which the first width "W1" is relatively small and the second width "W2" is relatively large, the acceptance angle θ will accordingly be relatively small. It will be appreciated that adjusting the sizes of the first and second lengths "L1," "L2" likewise can impact the acceptance angle θ.

In some embodiments it can be desirable to have a large acceptance angle θ for each slot 51(i.e., by providing relatively thin central members 50), which can thereby enhance the optical qualities of the mask 10. However, in some embodiments it can be desirable for the central members 50 to be relatively thicker so as to provide the ribs 26 with good mechanical support and heat dissipation. Using such thicker central members 50, however, can result in a smaller acceptance angle θ.

Figure 11:
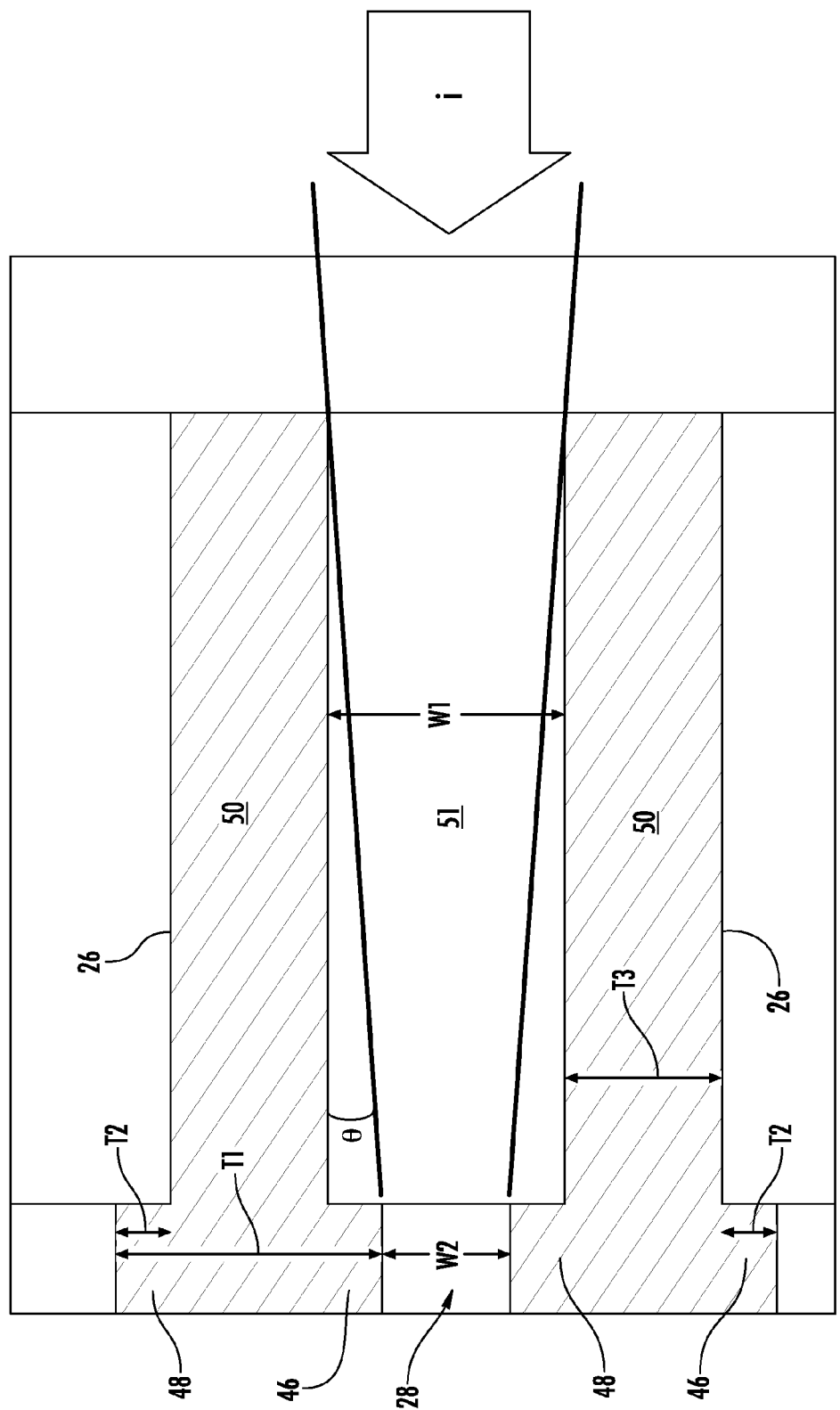

Referring to FIG. 11, several exemplary embodiments, with exemplary dimensions, are provided below for illustrative purposes. It will be understood that these dimensions are provided by way of mere example, and are not limiting in any way. Thus, it will be appreciated that a mask 10 according to the disclosure may have dimensions that vary from the following dimensions without departing from the scope of the present disclosure. The flanged portions of the central members 50 of the ribs 26 may each have a first thickness "T1" in a range of about 0.69 millimeters and about 0.89 millimeters, and in one embodiment the thickness may be about 0.79 millimeters. The flanges 46 and 48 of the ribs 26 may each have a second thickness "T2" in a range of about 0.18 millimeters to about 0.38 millimeters, and in one embodiment the thickness may be about 0.28 millimeters. The non-flanged portions of the central members 50 of the ribs 26 may each have a third thickness "T3" in a range of about 3 millimeters to about 5 millimeters, and in one embodiment the thickness may be about 4 millimeters. The first width "W1" (i.e., between the non-flanged portions of the central members 50 of adjacent ribs 26) may be in a range of about 1.11 millimeters to about 1.31 millimeters, and in one embodiment the first width may be about 1.21 millimeters. The second width "W2" (i.e., between the flanges 46 and 48 of adjacent ribs 26) may be in a range of about 0.55 millimeters to about 0.75 millimeters, and in one embodiment the second width may be about 0.65 millimeters. The acceptance angles θ defined by the ribs 26 may be in a range of about +/−2 degrees to about +/−10 degrees, and in one exemplary embodiment the acceptance angle may be about +/−4 degrees.

It will be appreciated by those of ordinary skill in the art that, due to the diffraction of an ion beam i that is projected through the mask 10, the dimensions of the mask 10, and particularly the dimensions of the ribs 26 and slots 28 of the mask 10, may largely depend on the position of the mask 10 relative to a substrate upon which the ion beam i is projected. For example, if the mask 10 is mounted in an ion chamber at a position that is relatively near an ion beam source and relatively farther away from a substrate onto which an ion beam i is projected, the dimensions of the ribs 26 and slots 28 may be significantly smaller than the dimensions of the corresponding features of a desired doping pattern. Conversely, if the mask 10 is mounted in an ion chamber at a position that is relatively far away from an ion beam source and immediately adjacent a substrate onto which an ion beam i is projected, the dimensions of the ribs 26 and slots 28 may be substantially equal to those of the corresponding features of a desired doping pattern.

Referring again to FIGS. 8 and 9, a side view of a single rib 26 of the mask 10 is shown (the frame 12 of the mask 10 has been omitted from this view for clarity). FIG. 8 shows the rib 26 in a relaxed, unheated state, such as may be experienced when the mask 10 is not exposed to an ion beam i projected thereon and therethrough (i.e., projected onto the ribs 26 and through the slots 28), or before the mask 10 has been significantly heated by an ion beam i projected thereon and therethrough. In this state, the bridge member 30 and parallel and perpendicular support legs 32 and 34 of the rib 26 are each substantially straight, and the shape and configuration of the mask 10, as well the doping pattern achieved therewith, are maintained as described in relation to the previous figures.

FIG. 9 shows the rib 26 in a heated, expanded state, such as may be experienced when the mask 10 is exposed to an ion beam i projected thereon and therethrough, such as during doping of a substrate (not shown). As will be appreciated, during implant operations, the ion beam i may be projected onto of the bridge member 30 of the rib 26, thereby causing the bridge member 30 to heat up. The heat may be conducted outwardly from the central portion of the bridge member 30, causing other portions of the rib 26 to heat up along a gradient (i.e., portions of the rib 26 that are nearer the central portion of the bridge member 30 may be hotter while portions of the rib 26 further away from the central portion of the bridge member 30 may be somewhat cooler).

When the rib 26 is heated in the manner described above, the rib 26 may expand, which may cause the rib 26 to flex or deform as shown in FIG. 9. Particularly, the bridge member 30 may flex or bow outward (i.e., to the left in FIG. 9), away from the ion beam source. The perpendicular support legs 34 may bend laterally outwardly to accommodate the expansion of the bridge member 30. However, due to the relative size and the orthogonal geometry of the bridge member 30 and the parallel and perpendicular support legs 32 and 34 of the rib 26 described above, the rib 26 may expand and deform relatively insignificantly in the longitudinal direction (i.e., in the left-to-right or right-to-left directions in FIG. 3) so that the spacing between adjacent ribs 26 may be maintained substantially constant, despite the deformation in the bridge member 30. Thus, while the rib 26 may bend, flex, deform, expand, and/or shift significantly in a direction that is parallel to the ion beam i that is projected thereon and thereby, the rib 26 may bend, flex, deform, expand, and/or shift only minimally in a direction that is normal to the ion beam i that is projected thereon and thereby. Since this is the case for all of the ribs 26 of the mask 10, the doping pattern that is achieved with the mask 10 may remain substantially unchanged when the mask 10 is heated during doping. The mask 10 therefore provides a significant advantage relative to existing ion beam masks which may expand or deform significantly in a direction normal to an ion beam when heated, thereby altering a desired doping pattern.

Figure 12:
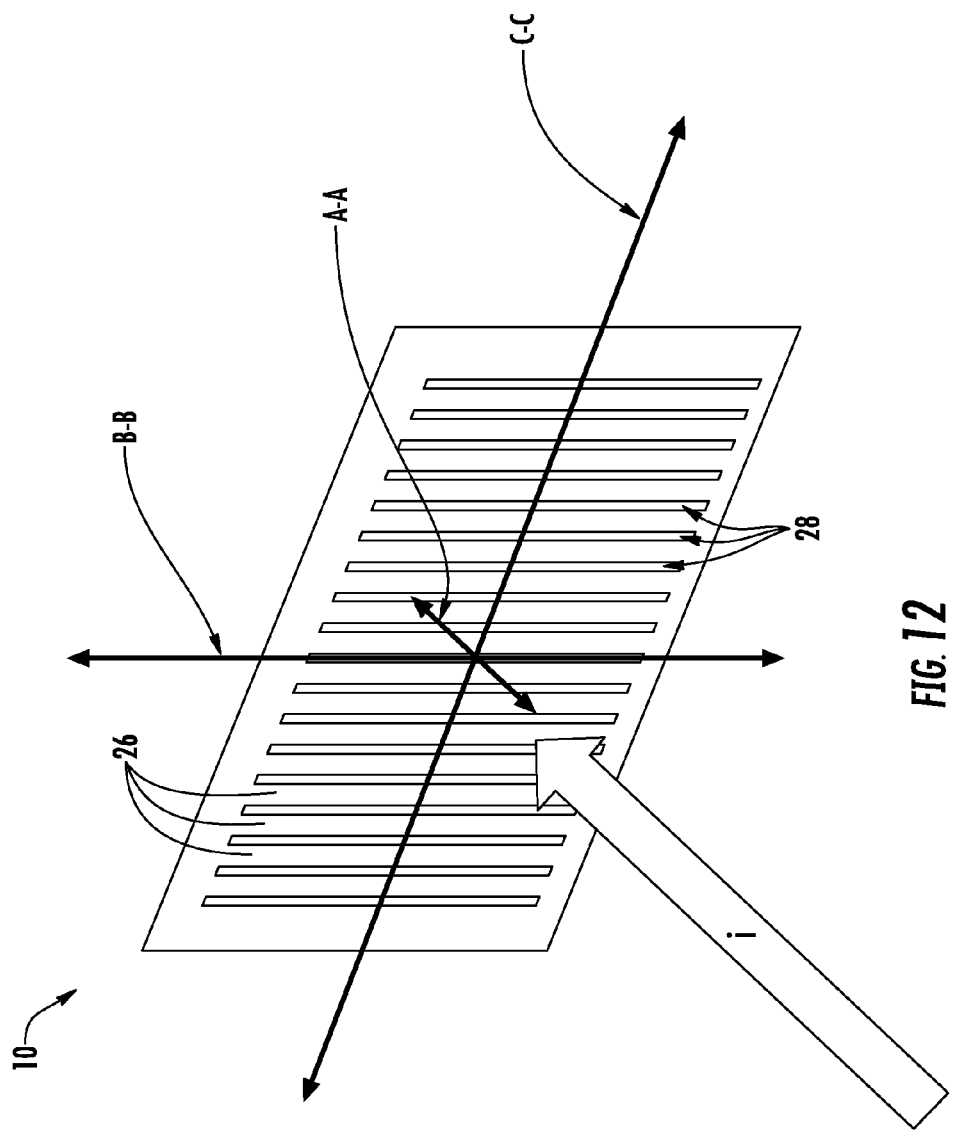
FIG. 12 is a front perspective view of the ion implanter proximity mask shown in FIG. 1 with an ion beam being projected therethrough.

FIG. 12 further illustrates the manner in which the ribs 26 of the mask 10 may expand and deform when an ion beam i is projected thereon. Particularly, the ribs 26 may expand and deform primarily in a direction parallel to the ion beam i (i.e., along axis A-A). The ribs 26 may expand and deform to a lesser extent in a direction perpendicular to the ion beam i and parallel to the direction in which the slots 28 extend (i.e., along axis B-B). Finally, the ribs 26 may expand and deform only minimally in a direction perpendicular to the ion beam i and perpendicular to the direction in which the slots 28 extend (i.e., along axis C-C). The doping pattern achieved by the disclosed mask 10 is thereby substantially preserved throughout thermal cycling of the mask 10.

While the rib 26 is shown in FIG. 9 as being oriented with its front side facing the source of the ion beam, it is contemplated that the orientation of the mask 10 may be reversed without departing from the present disclosure. Particularly, the mask 10 may be installed within an ion chamber with the rear side of the rib 26 facing the source of the ion beam. Oriented thusly, the rib 26 would bow or deform away from the ion beam source and toward a substrate that is being doped when the rib 26 is heated. Thus, regardless of the orientation of the mask 10, the ribs 26 may deform or expand insignificantly in a direction that is normal to the ion beam i, thereby preserving a desired doping pattern.

Thus, the present disclosure provides an exemplary embodiment of an ion implanter proximity mask 10 that is configured to resist thermal deformation in a direction normal to an ion beam projected thereon and therethrough, wherein, if unmitigated, such deformation could result in the distortion of an ion beam pattern projected onto a substrate.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The invention claimed is:

1. A proximity mask for ion implantation, the proximity mask comprising:
a plurality of parallel, spaced apart, ribs connected to a frame;
each of the plurality of ribs including a central bridge member connected at a first end to the frame by a first perpendicular support leg and a first parallel support leg, the first perpendicular support leg extending from the central bridge member in a direction normal to a front surface of the proximity mask, and the first parallel support leg extending from the first perpendicular support leg in a direction parallel to the front surface of the proximity mask;
wherein when the rib is exposed to an ion beam, the rib is configured to thermally expand such that a distance between adjacent ones of said plurality of ribs remains substantially constant.

2. The proximity mask in accordance with claim 1, further comprising a second perpendicular support leg that extends from a second end of the central bridge member in a direction normal to the front surface of the proximity mask.

3. The proximity mask in accordance with claim 2, further comprising a second parallel support leg that extends from the second perpendicular support leg in a direction parallel to the front surface of the proximity mask.

4. The proximity mask in accordance with claim 2, wherein a juncture of at least one of the first and second perpendicular support legs and corresponding first and second parallel support legs is chamfered.

5. The proximity mask in accordance with claim 2, wherein at least one of the first parallel support leg, second parallel support leg, first perpendicular support leg, and second perpendicular support leg is thinner than the bridge member.

6. The proximity mask in accordance with claim 2, wherein the frame defines a central aperture, wherein the plurality of ribs extend across the central aperture.

7. The proximity mask in accordance with claim 6, wherein the first and second parallel support legs are attached to respective first and second flanges that extend from the frame.

8. The proximity mask in accordance with claim 7, wherein a juncture of at least one of the first and second parallel support legs and corresponding first and second flanges is chamfered.

9. A proximity mask for ion implantation, the proximity mask comprising:
a frame defining a central aperture; and
a plurality of ribs disposed within the aperture and attached to the frame, each rib partially extending from the frame in a direction that is normal to a front surface of the proximity mask,
wherein the ribs define a doping pattern and are configured to thermally expand such that a distance between adjacent ones of said plurality of ribs remains substantially constant.

10. The proximity mask in accordance with claim 9, wherein each of the ribs comprises:
a bridge member;
first and second perpendicular support legs extending perpendicularly from the bridge member; and
first and second parallel support legs that extend perpendicularly from the first and second perpendicular support legs, respectively;
wherein the first and second parallel support legs are attached to the frame.

11. The proximity mask in accordance with claim 10, wherein the first and second parallel support legs are attached to respective first and second flanges that extend from the frame.

12. The proximity mask in accordance with claim 10, wherein the bridge member has a T-shaped cross section defined by a central member having a non-flanged portion and a flanged portion having two flanges extending in opposite directions from the central member.

13. The proximity mask in accordance with claim 12, wherein a first width W1 is defined between the non-flanged portions of the central members of adjacent ribs and a second width W2 is defined between the flanged portions of adjacent ribs, wherein W1 is greater than W2.

14. The proximity mask in accordance with claim 13, wherein the non-flanged portions of the central members have a first length L1 and the flanged portions of the central members have a second length L2, wherein L1 is greater than L2.

15. The proximity mask in accordance with claim 14, wherein a difference between W1 and W2 and a difference between L1 and L2 define an acceptance angle θ between adjacent ribs.

16. The proximity mask in accordance with claim 14, wherein the acceptance angle θ is in a range between 2 degrees and 10 degrees.

17. The proximity mask in accordance with claim 1, wherein the central bridge member has a T-shaped cross section defined by a central member having a non-flanged portion and a flanged portion having two flanges extending in opposite directions from the central member.

18. The proximity mask in accordance with claim 17, wherein a first width W1 is defined between the non-flanged portions of the central members of adjacent ribs and a second width W2 is defined between the flanged portions of adjacent ribs, wherein W1 is greater than W2.

19. The proximity mask in accordance with claim 18, wherein a difference between W1 and W2 and a difference between L1 and L2 define an acceptance angle θ.

20. The proximity mask in accordance with claim 18, wherein the non-flanged portions of the central members have a first length L1 and the flanged portions of the central members have a second length L2, wherein L1 is greater than L2.

* * * * *